(12) United States Patent
Gebreselasie et al.

(10) Patent No.: US 11,848,324 B2
(45) Date of Patent: Dec. 19, 2023

(54) EFUSE INSIDE AND GATE STRUCTURE ON TRIPLE-WELL REGION

(71) Applicant: GLOBALFOUNDRIES U.S. Inc., Malta, NY (US)

(72) Inventors: Ephrem G. Gebreselasie, South Burlington, VT (US); Steven M. Shank, Jericho, VT (US); Alain F. Loiseau, Williston, VT (US); Robert J. Gauthier, Jr., Williston, VT (US); Michel J. Abou-Khalil, Essex Junction, VT (US); Ahmed Y. Ginawi, South Burlington, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/483,104

(22) Filed: Sep. 23, 2021

(65) Prior Publication Data
US 2023/0088425 A1 Mar. 23, 2023

(51) Int. Cl.
*H01L 27/06* (2006.01)
*H01L 23/525* (2006.01)
*H01L 21/8234* (2006.01)

(52) U.S. Cl.
CPC .. *H01L 27/0629* (2013.01); *H01L 21/823481* (2013.01); *H01L 23/5256* (2013.01)

(58) Field of Classification Search
CPC ......... H01L 21/823481; H01L 23/5256; H01L 27/0649; H01L 27/112; H01L 29/665; H01L 27/11206

USPC .................. 257/529, 228; 438/132
See application file for complete search history.

(56) References Cited

U.S. PATENT DOCUMENTS

| | | | |
|---|---|---|---|
| 6,108,247 A | 8/2000 | Suzu et al. | |
| 8,304,839 B2 | 11/2012 | Thei et al. | |
| 8,625,377 B2 | 1/2014 | Rountree | |
| 10,127,992 B2 | 11/2018 | Chung | |
| 2008/0025067 A1 | 1/2008 | Scheuerlein et al. | |
| 2010/0133649 A1* | 6/2010 | Lin et al. ............ | H01L 23/5256 257/529 |
| 2011/0019495 A1* | 1/2011 | Scheuerlein et al. .... | 365/230.06 |
| 2013/0308366 A1 | 11/2013 | Chung | |

OTHER PUBLICATIONS

Taiwanese Office Action in related TW Application No. 111133106 dated Aug. 11, 2023, 10 pages.

* cited by examiner

*Primary Examiner* — Thinh T Nguyen
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to an eFuse and gate structure on a triple-well and methods of manufacture. The structure includes: a substrate comprising a bounded region; a gate structure formed within the bounded region; and an eFuse formed within the bounded region and electrically connected to the gate structure.

20 Claims, 6 Drawing Sheets

EFUSE INSIDE AND GATE STRUCTURE ON TRIPLE-WELL REGION

FIELD OF THE INVENTION

The present disclosure relates to semiconductor structures and, more particularly, to an eFuse and gate structure on a triple-well region and methods of manufacture.

BACKGROUND

An eFuse (electronic fuse) is a microscopic fuse used in computer chips. The eFuse allows for the dynamic real-time reprogramming of the chip. For example, by utilizing a set of eFuses, a chip manufacturer can allow for the circuits on a chip to change while it is in operation.

eFuses can be made from silicon or metal traces. These traces are weaker than other traces on the chips so as to fail before such other traces fail. In this way, by electromigration, as an example, the eFuses can blow and the chip can be programmed during operation. However, eFuses require a large chip area, particularly in technologies that only offer FETs in triple-well regions. For example, up to 12% of chip area can be used by eFuses in such a layout.

SUMMARY

In an aspect of the disclosure, a structure comprises: a substrate comprising a bounded region; a gate structure formed within the bounded region; and an eFuse formed within the bounded region and electrically connected to the gate structure.

In an aspect of the disclosure, a structure comprises: a substrate comprising a region bounded by a well; at least one shallow trench isolation structure within the region bounded by the well; a gate structure over the region bounded by the well; and an eFuse electrically connecting to the gate structure and over the at least on shallow trench isolation structure within the region bounded by the well.

In an aspect of the disclosure, a method comprises: forming a bounded region in a substrate surrounded by a well; forming at least one shallow trench isolation structure within the bounded region; forming a gate structure over the bounded region; and forming an eFuse electrically connecting to the gate structure, the eFuse formed over the at least on shallow trench isolation structure within the bounded region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an eFuse and gate structure over a triple-well region and methods of manufacture. More specifically, the eFuse structure comprises a silicide polysilicon eFuse inside a triple-well region (e.g., ring) in combination with a programming field effect transistor (FET). Advantageously, the silicide polysilicon eFuse within the triple-well region can provide a significant area savings in eFuse array cells. For example, the use of a silicide polysilicon eFuse within the triple-well region can have a 58% area saving in 8-bit eFuse array cell, compared to known eFuse layouts.

In more specific embodiments, the silicided polysilicon eFuse may be provided on top of a triple-well region with a programming FET; that is, the silicided polysilicon eFuse may share the same triple-well region with the programming FET. In further embodiments, the eFuse, programming FET, and a tie down diode may share the same triple-well region. The tie down diode may prevent plasma charging which occurs during fabrication processes and which may cause well and/or gate damage. It is further contemplated that an array of eFuses can be provided with all parallel bit cells in the same triple-well region. In further embodiments, the triple-well region may be replaced with a buried polysilicon layer. By grouping the eFuse and the FET inside the same triple-well (or over a buried polysilicon material), it is now possible to achieve a compact design layout.

The eFuse of the present disclosure can be manufactured in a number of ways using a number of different tools. In general, though, the methodologies and tools are used to form structures with dimensions in the micrometer and nanometer scale. The methodologies, i.e., technologies, employed to manufacture the eFuse of the present disclosure have been adopted from integrated circuit (IC) technology. For example, the structures are built on wafers and are realized in films of material patterned by photolithographic processes on the top of a wafer. In particular, the fabrication of the eFuse uses three basic building blocks: (i) deposition of thin films of material on a substrate, (ii) applying a patterned mask on top of the films by photolithographic imaging, and (iii) etching the films selectively to the mask.

Figure 1:
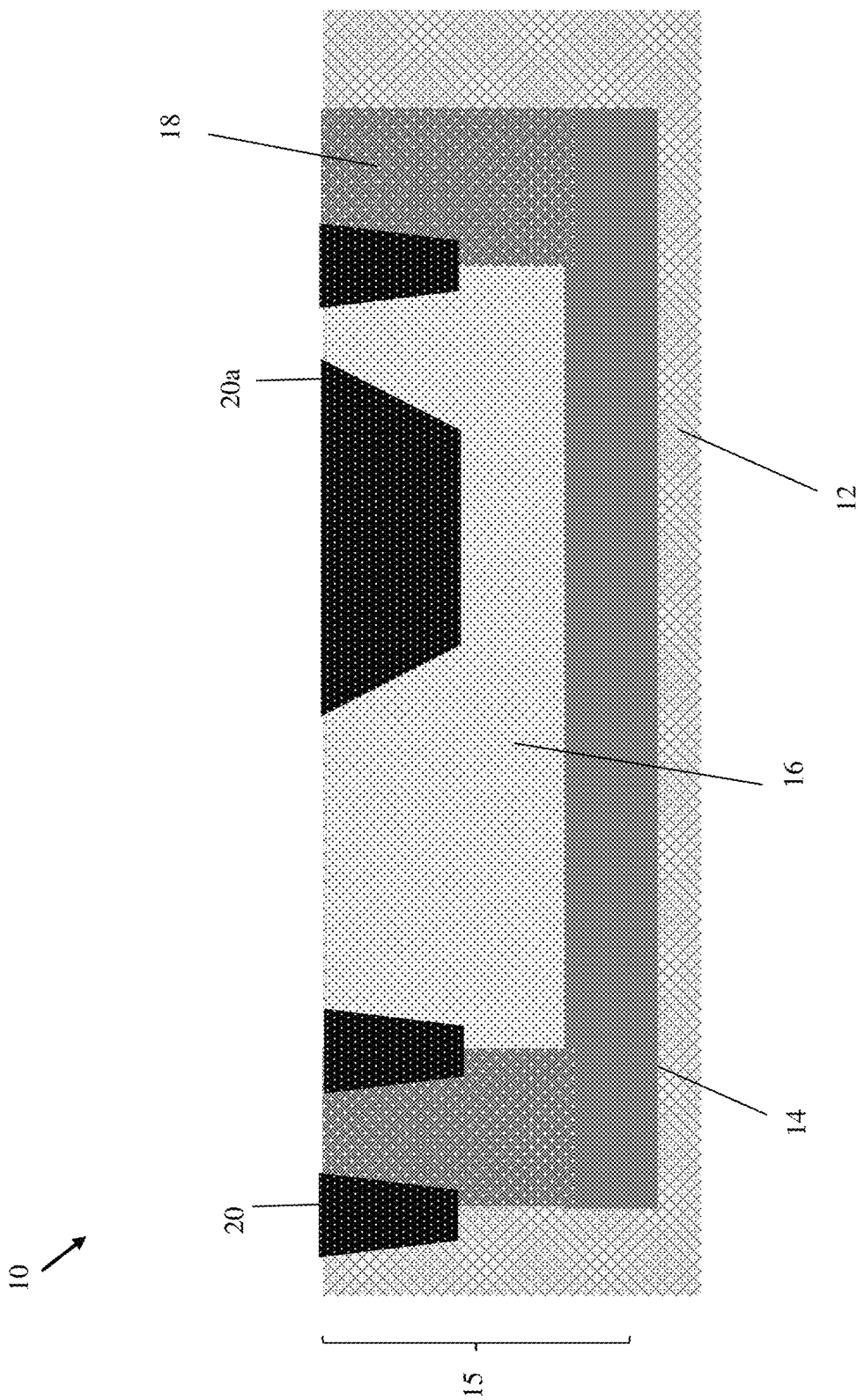
FIG. 1 shows a triple-well region, amongst other features, and respective fabrication processes in accordance with aspects of the present disclosure.

FIG. 1 shows a triple-well region, amongst other features, and respective fabrication processes in accordance with aspects of the present disclosure. More specifically, the structure 10 of FIG. 1 includes a substrate 12. In embodiments, the substrate 12 comprises a bulk substrate comprising any suitable crystallographic orientation (e.g., a (100), (110), (111), or (001) crystallographic orientation). The substrate 12 may be composed of any suitable material including, but not limited to, Si, SiGe, SiGeC, SiC, GaAs, InAs, InP, and other III/V or II/VI compound semiconductors.

FIG. 1 further shows a triple-well region 15 in the substrate 12. The triple-well region 15 comprises wells 14, 16, 18. In embodiments, the well 14 is a deep N-well, the well 16 is a P-well and the well 18 is an N-well surrounding the P-well 16 (providing an isolated well). In embodiments, the N-wells 14, 18 are doped with n-type dopants, e.g., Arsenic (As), Phosphorus (P) and Sb, among other suitable examples; whereas the P-well is doped with p-type dopants, e.g., Boron (B).

The wells 14, 16, 18 may be formed by introducing a dopant in the substrate 12, for example, using ion implantation processes. In embodiments, patterned implantation masks may be used to define selected areas exposed for the implantation processes. The implantation masks may include a layer of a light-sensitive material, such as an organic photoresist, applied by a spin coating process, pre-baked, exposed to light projected through a photomask, baked after exposure, and developed with a chemical developer. The implantation masks have a thickness and stopping power sufficient to block masked areas against receiving a dose of the implanted ions.

Still referring to FIG. 1, shallow trench isolation structures 20, 20a are formed in the substrate 12 and, preferably in the wells 16, 18 and at junctions thereof. In embodiments, the shallow trench isolation structure 20a may be entirely within the well 16. The shallow trench isolation structures 20, 20a may be formed using conventional lithography, etching and deposition processes. For example, a resist formed over the substrate 12 is exposed to energy (light) to form a pattern (opening). An etching process with a selective chemistry, e.g., reactive ion etching (RIE), will be used to transfer the pattern from the resist to the substrate 12 to form one or more trenches in the substrate 12 through the openings of the resist. Following the resist removal by a conventional oxygen ashing process or other known stripants, insulator material can be deposited by any conventional deposition processes, e.g., chemical vapor deposition (CVD) processes. Any residual material on the surface of the substrate 12 can be removed by conventional chemical mechanical polishing (CMP) processes.

Figure 2:
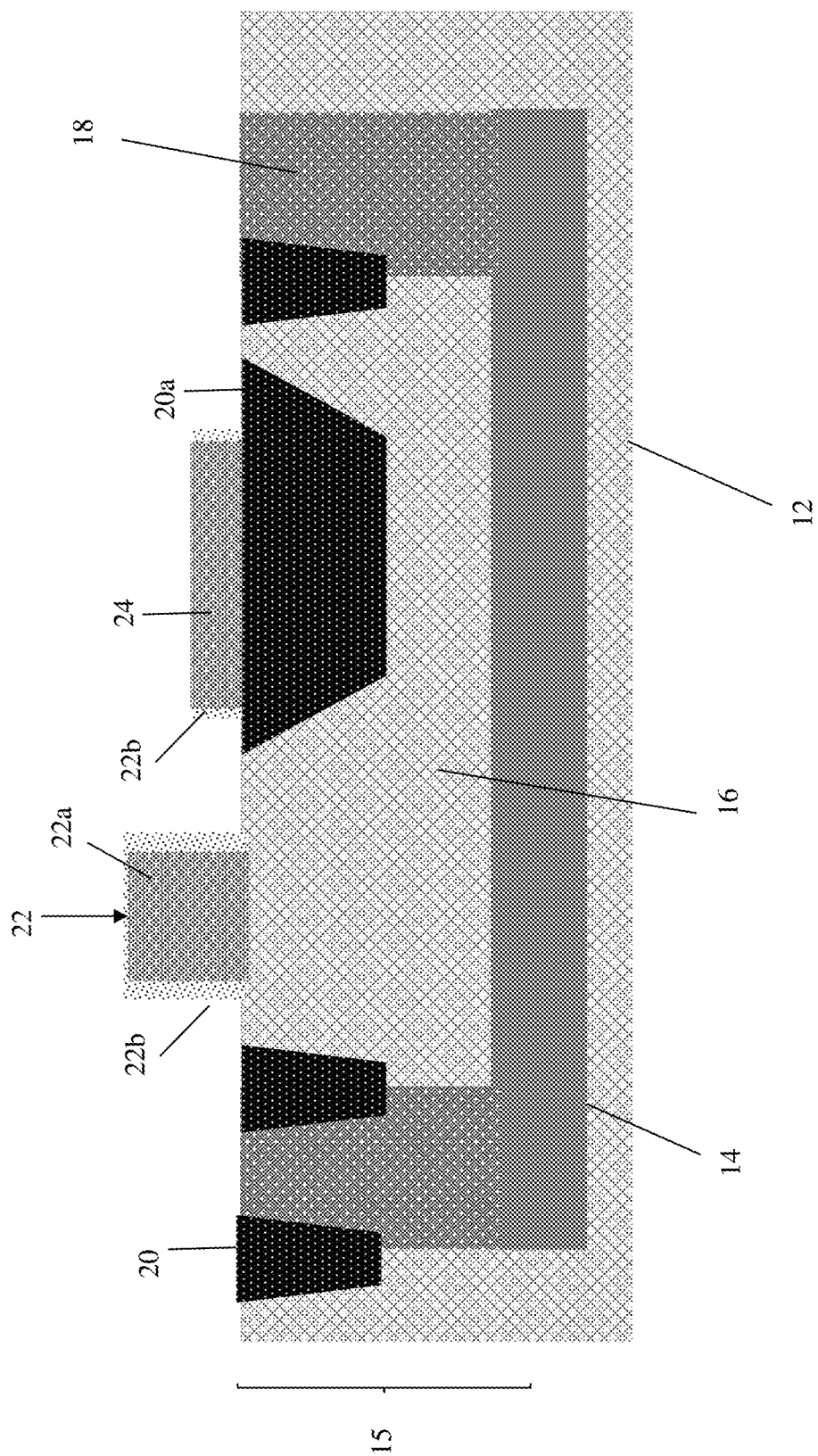
FIG. 2 shows an eFuse over the triple-well region, amongst other features, and respective fabrication processes in accordance with aspects of the present disclosure.

FIG. 2 shows an eFuse 24 and gate structure 22 over the triple-well region 15, amongst other features, and respective fabrication processes. For example, the eFuse and the gate structure 22 are completely bounded within the well 18, above the well 14 and within and/or above the well 16. In embodiments, both the gate structure 22 and eFuse 24 may comprise polysilicon material deposited and patterned using known deposition and patterning processes, e.g., lithography and etching processes.

In embodiments, the gate structure 22 may be formed by a gate first process. In the gate first process, for example, gate material 22a, e.g., gate dielectric material and polysilicon material, is deposited on the substrate 12 over the well 16, followed by a patterning process, e.g., lithography and etching processes. The deposition of the polysilicon material for the gate structure 22 may also be used for the eFuse 24. For example, the polysilicon material may be deposited using CVD processes. In embodiments, the gate dielectric material may be a low-k gate dielectric material, e.g., oxide. Following a patterning process in which the eFuse 24 is formed on the shallow trench isolation structure 20a and the gate structure 22 is formed over the well 16, sidewall spacers 22b may be formed on sidewalls of the patterned gate structures 22 and, optionally, the eFuse 24. The sidewall spacers 22b may be nitride or oxide material (or combinations thereof) formed by any known deposition process, followed by an anisotropic etching process.

Figure 3:
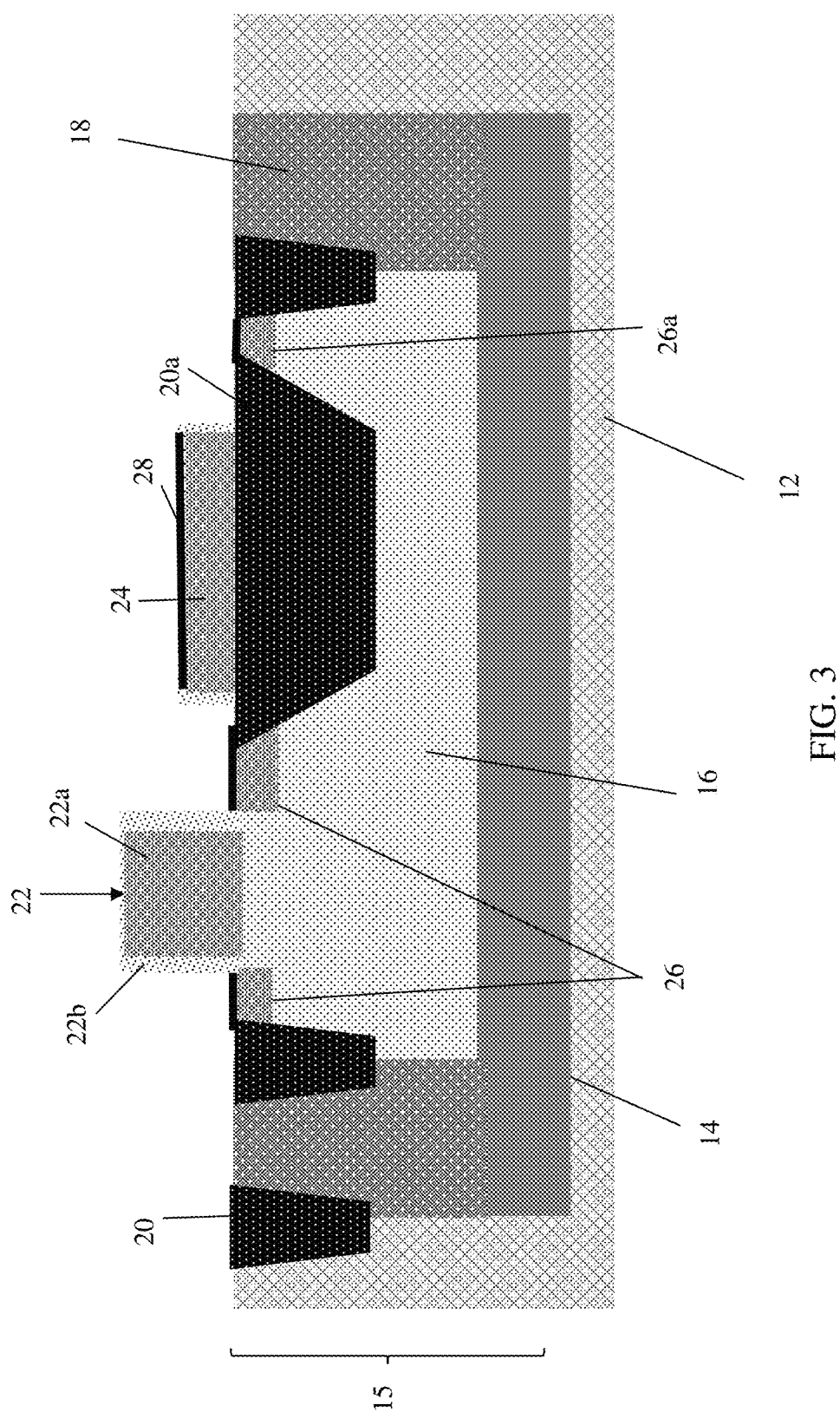
FIG. 3 shows silicide on the eFuse over the triple-well region, amongst other features, and respective fabrication processes in accordance with aspects of the present disclosure.

FIG. 3 shows silicide contacts 28 on the eFuse 24 and diffusion regions 26, 26a over the triple-well region 15, amongst other features. Prior to forming the silicide contacts 28, diffusion regions 26, 26a may be formed in the well 16 using conventional ion implantation processes known to those of skill in the art such that no further explanation is required for a complete understanding of the present disclosure. In embodiments, the diffusion region 26a may be a tie down diode which prevents plasma charging during subsequent processing steps. Also, the diffusion regions 26 may be source/drain regions formed by conventional implantation processes, including halo and extension implants formed in a sequential order after deposition of sidewall spacer material.

The silicide contacts 28 may be formed by conventional silicide processes. For example, the silicide process begins with deposition of a thin transition metal layer, e.g., nickel, cobalt or titanium, over fully formed and patterned semiconductor devices (e.g., diffusions 26, 26a, eFuse 24 and gate structure 22 (not shown in this cross-sectional view)). After deposition of the material, the structure is heated allowing the transition metal to react with exposed semiconductor material (Si or other semiconductor material as described herein) in the active regions of the device forming a low-resistance transition metal silicide. Following the reaction, any remaining transition metal is removed by chemical etching, leaving silicide contacts 28 in the active regions of the device 22 and on the eFuse 24.

Figure 4:
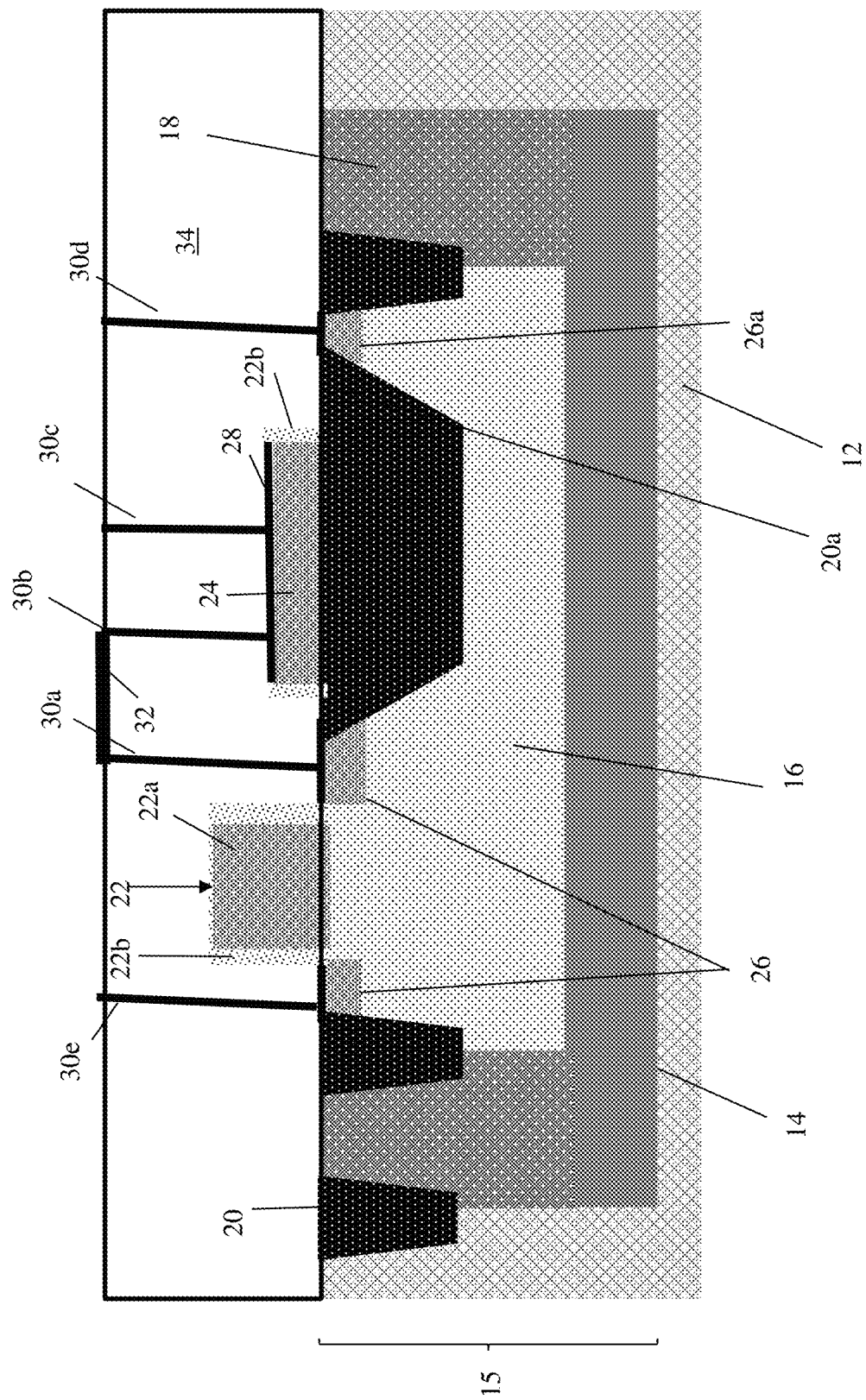
FIG. 4 shows contacts to the eFuse over the triple-well region, amongst other features, and respective fabrication processes in accordance with aspects of the present disclosure.

FIG. 4 shows contacts to the eFuse 24 and other components over the triple-well region 15, amongst other features. More specifically, contacts 30a-30e (e.g., metallization features) are formed on the diffusions 26, 26a and the eFuse 24 (and gate material 22a of the gate structure 22 (not shown in this cross-sectional view)). In embodiments, the contacts 30a-30e may be formed by conventional processes. For example, a stack of interlevel dielectric material 34 may be deposited by conventional deposition processes (e.g., CVD) followed by lithography and etching processes to form trenches exposing the silicide contacts 28 (or metal features on the silicide contacts 28). Following the trench formation in the interlevel dielectric material 34, conductive material can be deposited by any conventional deposition processes, e.g., CVD processes, to form the contacts 30a-30e. Any residual material on the surface of the interlevel dielectric material 34 can be removed by conventional chemical mechanical polishing (CMP) processes.

FIG. 4 also shows another metallization feature, e.g., wiring structure 32 connecting the eFuse 24 to the gate structure 22. In embodiments, the wiring structure 32 may be formed through conventional CMOS processes similar to the contacts 30a-30c such that no further explanation is required herein for a complete understanding of the present disclosure. In embodiments, the wiring structure 32 makes contact to the contact 30a of the diffusion 26 of the gate structure 22 and the contact 30b of the eFuse 24. In this way, the eFuse 24 is electrically linked to the gate structure 22, e.g., the programming FET.

Figure 5:
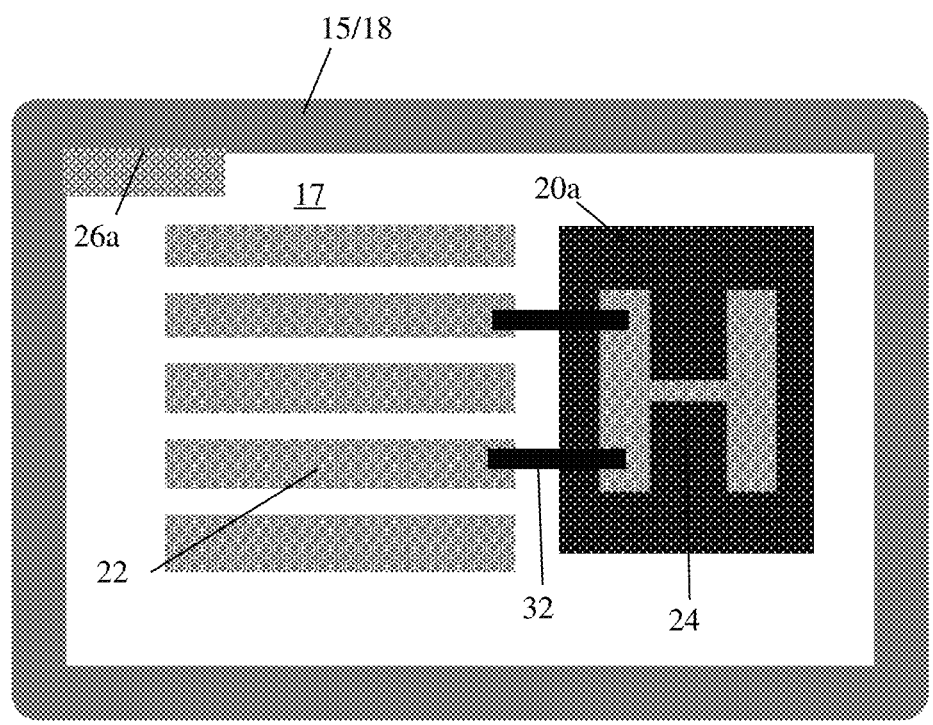
FIG. 5 shows a top view of the eFuse and gate structure over the triple-well region, amongst other features.

FIG. 5 shows a top view of the eFuse 24 over an isolated well (e.g., P-well 16) of the triple-well region 15 (defined by the N-well 18), amongst other features. More specifically, FIG. 5 shows the eFuse 24, gate structure 22 and diffusion region 26a (e.g., tie down diode) sitting over and sharing a single triple-well region 15, defined by the N-well 18 (e.g., N-well ring). As further shown in FIG. 5, the gate structure 22 may be a multiple finger FET (or parallel bit cells) over the triple-well region 15, connecting to the eFuse 24 by interconnects 32. Moreover, the eFuse 24 may be provided over the shallow trench isolation structure 24, within the triple-well region 15.

Figure 6:
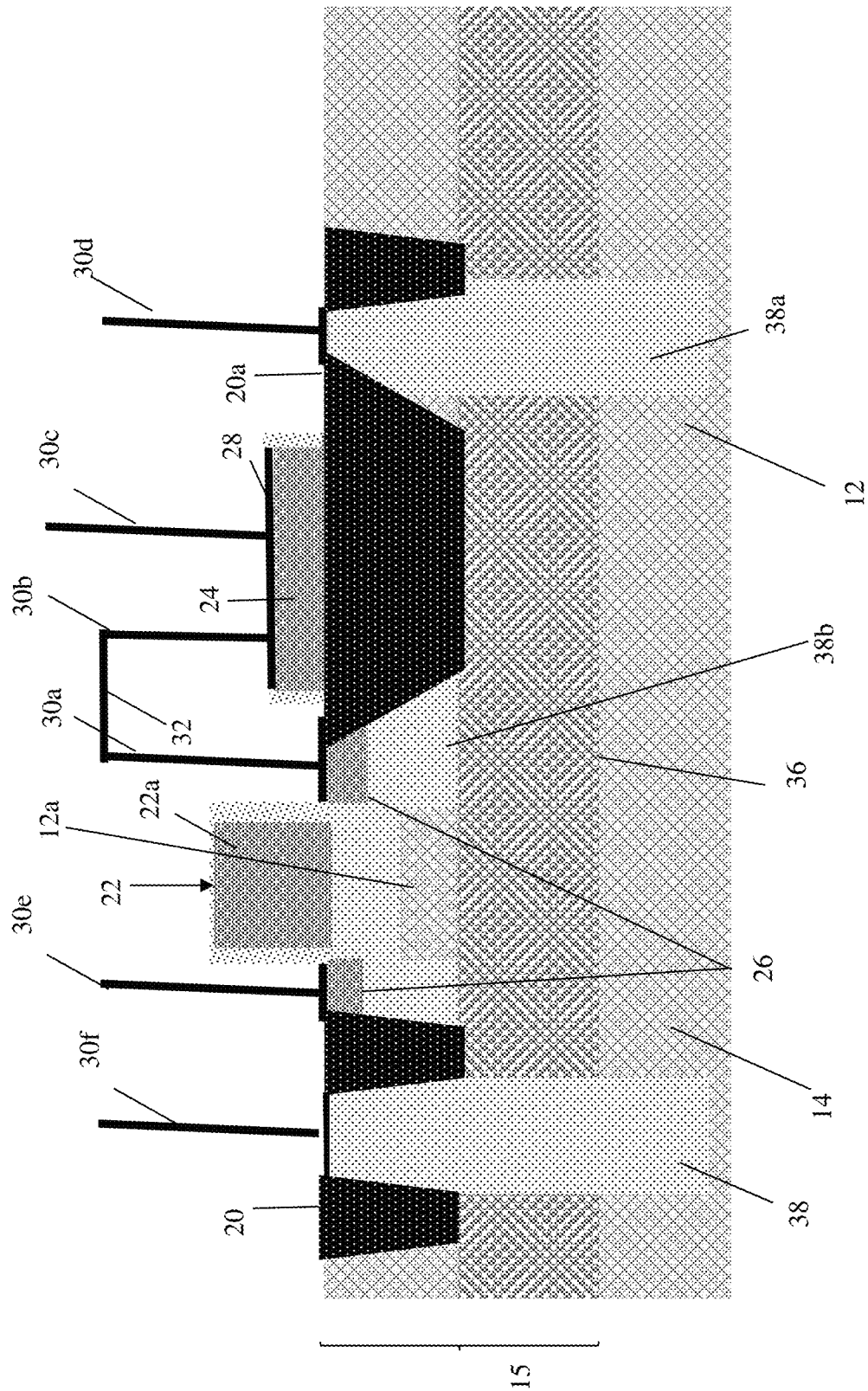
FIG. 6 shows the eFuse over a buried amorphous semiconductor layer, amongst other features, and respective fabrication processes in accordance with additional aspects of the present disclosure.

FIG. 6 shows the eFuse 24 over a buried amorphous semiconductor layer 36 in the substrate 12 and bounded by P-well regions 38, 38a. In this embodiment, the wells 14, 16 can be eliminated. In embodiments, the buried amorphous semiconductor layer 36 may be fabricated by amorphizing the substrate 12 using an implant process with an implantation mask to protect areas of the substrate used to form the P-well regions 38, 38a, for example. The implant process may be provided below a critical dose that prevents recrystallization of the substrate 12, e.g., single crystalline material. In embodiments, the implant process can be an argon implant process at a dosage level of approximately 1E14 to 1.5 E15, followed by an anneal process (e.g., 950° C. to 1100° C.) to form a layer of polysilicon material. The implant processes can also use other implant elements, e.g., other inert gases such as other noble gases such as xenon, germanium, nitrogen, or oxygen, etc., provided prior to the formation of the eFuse 24 and gate structure 22. The buried amorphous semiconductor layer 36 connects to the bottom portion of the N-well 18, bounding the eFuse 24 and gate structure 22.

In addition, the P-well regions 38, 38a and P-well 38b may be formed in the substrate 12 using, e.g., ion implantation processes. As disclosed already, the implantation mask used in the ion implantation process of the buried amorphous semiconductor layer 36 will prevent the formation of the amorphous semiconductor layer 36 at locations of the P-well regions 38, 38a. The P-well 38a may be used for the diffusion 26a (e.g., diode) and the P-well 38b may be used for the gate structure 22. In embodiments, the P-wells 38, 38a connect (contact) to the substrate 12 below the buried amorphous semiconductor layer 36. In this way, the P-well regions 38, 38a may form a ring extending below the amorphous semiconductor layer 36 and connecting to the substrate 12, while also bounding the eFuse 24 and the gate structure 22. It should also be understood by those of skill in the art that the ion implantation process of the P-well 38b may recrystallize the substrate, e.g., between the well 38b and the buried amorphous semiconductor layer 36, as shown as single crystalline material 12a. Also, in this embodiment, the gate structure 22 may be a floating body FET.

The eFuse can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate comprising a bounded region comprising a triple well region comprising a deep N-well, a P-well above the deep N-well and an N-well ring surrounding the deep P-well and above the deep N-well;
   a gate structure formed directly over the P-well of the bounded region; and
   an eFuse formed directly over the P-well of the bounded region and electrically connected to the gate structure.

2. The structure of claim 1, wherein the N well ring surrounds the gate structure and the eFuse.

3. The structure of claim 2, wherein the N-well ring contacts the deep N-well.

4. The structure of claim 2, wherein the eFuse sits over a shallow trench isolation structure within the P-well and electrically connects to the gate structure by at least one metallization feature.

5. The structure of claim 4, wherein the eFuse comprises a silicided polysilicon material.

6. The structure of claim 5, wherein the gate structure comprises a field effect transistor and comprises a polysilicon gate structure.

7. The structure of claim 5, further comprising a tie down diode within the triple-well region.

8. The structure of claim 1, wherein the bounded region comprises an amorphous semiconductor layer buried in the substrate and the P-well extending through the amorphous semiconductor layer.

9. The structure of claim 8, wherein the gate structure and the eFuse are above the amorphous semiconductor layer.

10. The structure of claim 9, wherein the amorphous semiconductor layer comprises polysilicon material.

11. The structure of claim 10, wherein the gate structure comprising a floating body field effect transistor.

12. A structure comprising:
    a substrate comprising a region bounded by a well comprising a triple well region comprising a deep N-well, a P-well above the deep N-well and an N-well ring surrounding the P-well and above the deep N-well;
    at least one shallow trench isolation structure within the region bounded by the well;
    a gate structure directly over the P-well of the region bounded by the well; and
    an eFuse electrically connecting to the gate structure and over the at least on shallow trench isolation structure, directly over the P-well of the region bounded.

13. The structure of claim 12, further comprising a diffusion region in the region bounded by the well.

14. The structure of claim 13, wherein the diffusion region comprises a tie down diode.

15. The structure of claim 12, wherein the P-well is over the deep N-well and is surrounded by the N-well ring.

16. The structure of claim 15, wherein the gate structure comprises parallel bit cells in the triple-well region.

17. The structure of claim 15, further comprising shallow trench isolation structures at junctions of the triple-well region.

18. The structure of claim 12, wherein the well comprises a P-well ring extending through a buried polysilicon material.

19. The structure of claim 18, wherein the gate structure is a floating body gate structure.

20. A method comprising:
    forming a bounded region in a substrate surrounded by a well comprising a triple well region comprising a deep N-well, a P-well above the deep N-well and an N-well ring surrounding the P-well and above the deep N-well;
    forming at least one shallow trench isolation structure within the bounded region;
    forming a gate structure directly over the P-well of the bounded region; and
    forming an eFuse electrically connecting to the gate structure, the eFuse formed over the at least one shallow trench isolation structure, directly over the P-well of the bounded region.

\* \* \* \* \*